United States Patent
Carcasi et al.

(10) Patent No.: US 12,424,467 B2
(45) Date of Patent: *Sep. 23, 2025

(54) SYSTEMS AND METHODS FOR DETERMINING A LOCALIZED FLUID VELOCITY ON A SPINNING SUBSTRATE BY TRACKING MOVEMENT OF A TRACER ACROSS THE SPINNING SUBSTRATE

(71) Applicant: Tokyo Electron Limited, Tokyo (JP)

(72) Inventors: Michael Carcasi, Austin, TX (US);
Sean Berglund, Austin, TX (US);
Ankur Agarwal, Austin, TX (US);
Steven Gueci, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 37 days.

This patent is subject to a terminal disclaimer.

(21) Appl. No.: 18/210,762

(22) Filed: Jun. 16, 2023

(65) Prior Publication Data
US 2024/0420973 A1    Dec. 19, 2024

(51) Int. Cl.
*H01L 21/02*    (2006.01)
*H01L 21/67*    (2006.01)
*H01L 21/687*    (2006.01)

(52) U.S. Cl.
CPC .... *H01L 21/6715* (2013.01); *H01L 21/02057* (2013.01); *H01L 21/67253* (2013.01); *H01L 21/68764* (2013.01)

(58) Field of Classification Search
CPC .......... H01L 21/6715; H01L 21/02057; H01L 21/67253; H01L 21/68764; H01L 21/67051
See application file for complete search history.

(56) References Cited

U.S. PATENT DOCUMENTS

| | | |
|---|---|---|
| 10,048,587 B2 | 8/2018 | Carcasi et al. |
| 2008/0011322 A1* | 1/2008 | Weber ............... H01L 21/67051 134/198 |
| 2020/0338510 A1 | 10/2020 | Nasman et al. |

OTHER PUBLICATIONS

Kim et al., "The Flow And Hydrodynamic Stability Of A Liquid Film On A Rotating Disc", IOP Publishing, Fluid Dynamics Research, 2009, 30 pgs.

(Continued)

*Primary Examiner* — Erin F Bergner
(74) *Attorney, Agent, or Firm* — Egan, Enders & Huston LLP.

(57) ABSTRACT

Systems and methods are provided to control operational parameter(s) of a spin-on process based on a localized fluid velocity of a processing liquid dispensed onto a surface of a spinning semiconductor substrate. In the present disclosure, a tracer is introduced within, or incorporated onto a surface of, a processing liquid as the processing liquid is dispensed onto the spinning semiconductor substrate. Movement of the tracer is tracked over time, as the tracer flows along with the processing liquid across the spinning substrate surface, to determine a localized fluid velocity of the processing liquid at one or more radial positions on the substrate surface. The localized fluid velocity is then used to control one or more operational parameters of a spin-on process.

14 Claims, 6 Drawing Sheets

(56) References Cited

OTHER PUBLICATIONS

Korzhova, "Motion Analysis Of Fluid Flow In A Spinning Disk Reactor", Scholar Commons, University of South Florida, 2009, 96 pgs.
Korzhova, "Tracking Fluid Flow In A Spinning Disk Reactor", Scholar Commons, University of South Florida, 2006, 43 pgs.
Sisoev et al., "Stationary Spiral Waves In Film Flow Over A Spinning Disk", Physics Of Fluid, 2010, 7 pgs.

* cited by examiner

SYSTEMS AND METHODS FOR DETERMINING A LOCALIZED FLUID VELOCITY ON A SPINNING SUBSTRATE BY TRACKING MOVEMENT OF A TRACER ACROSS THE SPINNING SUBSTRATE

RELATED ART

The present disclosure is related to co-pending U.S. patent application Ser. No. 18/210,772, entitled "Systems and Methods for Determining a Localized Fluid Velocity of a Processing Liquid Dispensed on a Spinning Substrate by Tracking Movement of an Induced Perturbation in the Processing Liquid Across the Spinning Substrate" and co-pending U.S. patent application Ser. No. 18/210,773, entitled "Systems and Methods for Determining a Fluid Height and/or a Fluid Velocity of a Processing Liquid Dispensed on a Spinning Substrate", each of which is filed concurrently on Jun. 16, 2023 and incorporated by reference herein.

BACKGROUND

The present disclosure relates to the processing of semiconductor substrates. In particular, the present disclosure relates to systems and methods for determining a localized fluid velocity of a processing fluid dispensed onto a spinning substrate.

Semiconductor fabrication processes may involve a wide variety of processing steps, including depositing, growing, patterning, etching, coating, developing and cleaning steps. Some of these processing steps may be spin-on processes, which are performed on a semiconductor substrate while the semiconductor substrate is disposed within a processing chamber having a spin chuck and at least one liquid dispense nozzle.

FIG. 1 illustrates one example of a processing chamber 100 having a spin chuck 110 and at least one liquid dispense nozzle 120. In a conventional spin-on process, a semiconductor substrate (or wafer W) to be processed is positioned on a spin chuck 110 and held in place, for example, by vacuum pressure or mechanical pin holders. During various processing steps, the spin chuck 110 and the semiconductor substrate W mounted thereon are rotated by a drive mechanism 115, which may be a stepper motor, etc. The drive mechanism 115 causes the spin chuck 110 to spin at a variety of rotational speeds during the application and flow of a liquid material onto a surface of the semiconductor substrate W.

In the processing chamber 100 shown in FIG. 1, a cup 130 is provided to capture processing liquids that are ejected or fall from the surface of the semiconductor substrate W. The spin chuck 110 and drive mechanism 115 are disposed within an opening in the cup 130. The spin chuck 110 supports and rotates (i.e., spins) the semiconductor substrate W about its central normal axis relative to the cup 130, which is stationary. As the spin chuck 110 rotates, the cup 130 captures and collects a majority of the processing liquid, which is ejected from the surface of the semiconductor substrate W by the centrifugal forces generated during rotation of the spin chuck 110. The liquid collected by the cup 130 is drained via a drain line 135 and drain unit (not shown). An exhaust line 137 and exhaust unit (not shown), such as a vacuum pump or other negative pressure-generating device, may also be provided within the processing chamber 100 to remove gaseous species (including but not limited to vapors released from substrate layers during processing) from the processing space inside the cup 130.

The at least one nozzle 120 is coupled to a liquid supply unit (not shown) through a liquid supply line 125 for dispensing a variety of processing liquids (L) onto the surface of the semiconductor substrate W. The processing liquid(s) supplied to the substrate surface may generally depend on the processing step(s) being performed. For example, the nozzle 120 may dispense a processing liquid onto the surface of the semiconductor substrate W to coat the substrate surface and form a layer of material (for example, a metal layer, a dielectric layer, a photoresist, etc.) on the substrate surface. In some cases, a patterning layer may be formed over the material layer and the material layer may be subsequently etched by dispensing an etchant chemical from the nozzle 120 onto the patterning layer. In another example, the nozzle 120 may dispense a develop solution onto the surface of the semiconductor substrate W to develop a layer previously deposited (for example, a photoresist layer) on the substrate surface. In yet other examples, the nozzle 120 may dispense a cleaning chemical and/or a rinse solvent onto the surface of the semiconductor substrate W to clean and/or rinse the substrate surface.

In spin-on processes, processing liquid(s) are dispensed onto the surface of the semiconductor substrate W while spin chuck 110 spins the substrate W at one or more specified rotational speeds. The processing liquid(s) may be dispensed in accordance with a predetermined process recipe. In some spin-on processes, for example, nozzle 120 may dispense a given processing liquid onto the substrate surface at a predetermined flow rate from one or more fixed locations while the substrate rotates at a predetermined rotation speed. In other spin-on processes, nozzle 120 may be scanned across the substrate surface at a specified scan rate while dispensing a given processing liquid onto the spinning substrate surface at a specified flow rate.

In some cases, the local fluid dynamics of a processing liquid dispensed onto a spinning substrate may adversely affect the local area performance of the substrate. For example, the local fluid dynamics introduced during a spin-on process may adversely affect critical dimensions on a patterned substrate, cause pattern collapse, etc. Thus, it would be beneficial to take local fluid dynamics into account when developing and/or optimizing a process recipe for a spin-on process.

SUMMARY

The present disclosure provides various embodiments of systems and methods that avoid adverse local fluid dynamic effects on a patterned substrate during a spin-on process. More specifically, the present disclosure provides embodiments of improved processing systems and methods that control operational parameter(s) of a spin-on process based on a localized fluid velocity of a processing liquid dispensed onto a surface of a spinning semiconductor substrate.

In the present disclosure, a tracer is introduced within, or incorporated onto a surface of, the processing liquid as the processing liquid is dispensed onto the spinning semiconductor substrate. Movement of the tracer is tracked over time, as the tracer flows along with the processing liquid across the spinning substrate surface, to determine a localized fluid velocity of the processing liquid at one or more radial positions on the substrate surface. The localized fluid velocity is then used to control one or more operational parameters (for example, the flow rate of the processing liquid dispensed onto the substrate, the rotational speed of the spin chuck, the scan rate or scan position of the nozzle, etc.) of a spin-on process. By controlling the operational parameters of the spin-process based on the localized fluid velocity, the embodiments disclosed herein avoid the local fluid dynamic effects that tend to adversely affect the local area performance of patterned substrates during conventional spin-on processes.

According to one embodiment, a method is provided herein for controlling one or more operational parameters of a spin-on process used to dispense a processing liquid onto a surface of a semiconductor substrate. In some embodiments, the method may begin by dispensing the processing liquid onto the surface of the semiconductor substrate while the semiconductor substrate is rotated at a predetermined rotational speed. Although the processing liquid is dispensed at a predetermined flow rate, the processing liquid flows in a radial direction across the surface of the semiconductor substrate toward a periphery of the semiconductor substrate at an unknown fluid velocity.

The method further includes dispensing a tracer within, or onto a surface of, the processing liquid while the processing liquid is dispensed onto the surface of the semiconductor substrate, wherein the tracer flows along with the processing liquid at the unknown fluid velocity. A wide variety of tracers may be dispensed. In some embodiments, the tracer may be dispensed onto the surface of processing liquid. Examples of tracers that may be dispensed onto the surface of processing liquid include, but are not limited to, foaming agents and immiscible liquids. Foaming agents (such as non-ionic surfactants and/or blowing agents) facilitate the formation of bubbles or foam, which interface with the surface of the processing liquid and flow along with the processing liquid at the unknown fluid velocity. Immiscible liquids include solvents that do not mix with the processing liquid. When an immiscible liquid is used as a tracer, droplets of the immiscible liquid are dispensed onto the surface of the processing liquid at a predetermined duty cycle. The droplets of the immiscible liquid interface with the surface of the processing liquid and flow along with the processing liquid at the unknown fluid velocity.

In other embodiments, the tracer may be dispensed within processing liquid. Examples of tracers that may be dispensed within the processing liquid include, but are not limited to, gas bubbles, optical sensor contrast agents, pH indicators, fluorescent species and phosphorescent species. In some embodiments, the tracer may be incorporated within the processing liquid before the processing liquid and the tracer are dispensed onto the surface of the semiconductor substrate. In such embodiments, the processing liquid and the tracer may be dispensed through a single nozzle. In other embodiments, the tracer may be incorporated within the processing liquid after the processing liquid has begun dispensing. In such embodiments, the processing liquid may be dispensed through a first nozzle and the tracer may be dispensed through a second nozzle.

The method further includes tracking movement of the tracer over time as the tracer flows along with the processing liquid at the unknown fluid velocity, and utilizing the tracked movement of the tracer to determine a localized fluid velocity of the processing liquid at one or more radial positions on the semiconductor substrate. In some embodiments, the movement of the tracer may be tracked by obtaining a plurality of images of the surface of the semiconductor substrate as the tracer flows along with the processing liquid at the unknown fluid velocity. In such embodiments, the method may analyze the plurality of images to determine a first radial position of the tracer at a first time and a second radial position of the tracer at a second time, which is greater than the first time, and determine the localized fluid velocity of the processing liquid at the second radial position by dividing a difference between the second radial position and the first radial position by a difference between the second time and the first time.

The method further includes controlling the one or more operational parameters of the spin-on process based on the localized fluid velocity of the processing liquid at the one or more radial positions. For example, the method may control the predetermined rotational speed at which the semiconductor substrate is rotated, the predetermined flow rate at which the processing liquid is dispensed, a position of a nozzle dispensing the processing liquid, and/or a scan rate of the nozzle based on the localized fluid velocity of the processing liquid.

According to another embodiment, a system that utilizes the method is also provided herein. The system disclosed herein may generally include a spin chuck, a liquid dispense system, an optical sensor and at least one programmable integrated circuit (IC), which is configured to execute program instructions stored within a non-transitory memory. The spin chuck, which has a support surface for supporting a semiconductor substrate, is configured to rotate the semiconductor substrate at a predetermined rotational speed. The liquid dispense system has at least one nozzle, which is coupled to dispense a processing liquid and a tracer onto a surface of the semiconductor substrate while the semiconductor substrate is rotated by the spin chuck. Although the at least one nozzle dispenses the processing liquid at a predetermined flow rate, the processing liquid and the tracer flow in a radial direction across the surface of the semiconductor substrate toward a periphery of the semiconductor substrate at an unknown fluid velocity.

The optical sensor is coupled to track movement of the tracer over time as the tracer flows along with the processing liquid at the unknown fluid velocity. The at least one programmable IC, which is coupled to the optical sensor, the liquid dispense system and the spin chuck, is configured to execute the program instructions stored within the non-transitory memory to: (a) receive an output signal from the optical sensor, the output signal used to track the movement of the tracer over time; (b) determine a localized fluid velocity of the processing liquid at one or more radial positions on the semiconductor substrate using the output signal received from the optical sensor; and (c) control one or more operational parameters of a spin-on process based on the localized fluid velocity of the processing liquid determined at the one or more radial positions.

In some embodiments, the optical sensor may be a camera, which is coupled to capture a plurality of images of the surface of the semiconductor substrate as the tracer flows along with the processing liquid at the unknown fluid velocity. In such embodiments, the at least one programmable IC may be coupled to receive the plurality of images from the camera and execute the program instructions stored within the non-transitory memory to: (a) analyze the plurality of images received from the camera to determine a first radial position of the tracer at a first time and a second radial position of the tracer at a second time, which is greater than the first time; and (b) determine the localized fluid velocity of the processing liquid at the second radial position by dividing a difference between the second radial position and the first radial position by a difference between the second time and the first time.

The at least one programmable IC may be further configured to execute the program instructions stored within the non-transitory memory to control one or more of the following based on the localized fluid velocity of the processing liquid: (a) the predetermined rotational speed of the spin chuck; (b) the predetermined flow rate at which the processing liquid is dispensed by the at least one nozzle; (c) a position of the at least one nozzle; and (d) a scan rate of the at least one nozzle.

As noted above, the liquid dispense system may have at least one nozzle, which is coupled to dispense a processing liquid and a tracer onto a surface of the semiconductor substrate while the semiconductor substrate is rotated by the spin chuck. As noted above, the tracer may be dispensed within, or onto the surface of, the processing liquid.

In some embodiments, the at least one nozzle may include a first nozzle for dispensing the processing liquid onto the surface of the semiconductor substrate and a second nozzle for dispensing the tracer onto the surface of the processing liquid. In one example implementation, the second nozzle may dispense a foaming agent to facilitate formation of bubbles, which interface with the surface of the processing liquid and flow along with the processing liquid at the unknown fluid velocity as the tracer. The foaming agent may include a non-ionic surfactant or a blowing agent. In another example implementation, the second nozzle may dispense droplets of an immiscible liquid onto the surface of the processing liquid at a predetermined duty cycle. The immiscible liquid may include a solvent that does not mix with the processing liquid. When an immiscible liquid is used as a tracer, the droplets of the immiscible liquid interface with the surface of the processing liquid and flow along with the processing liquid at the unknown fluid velocity.

In other embodiments, the at least one nozzle may include one or more nozzles for dispensing the tracer within the processing liquid. Examples of tracers that may be dispensed within the processing liquid include: gas bubbles, optical sensor contrast agents, pH indicators, fluorescent species and phosphorescent species. In some embodiments, the tracer may be incorporated within the processing liquid before the processing liquid and the tracer are dispensed onto the surface of the semiconductor substrate through a single nozzle. In other embodiments, the tracer may be incorporated within the processing liquid after the processing liquid has begun dispensing. In such embodiments, the processing liquid may be dispensed through a first nozzle and the tracer may be dispensed through a second nozzle.

Various embodiments of systems and methods are provided herein for processing a semiconductor substrate, and more specifically, for controlling operational parameter(s) of a spin-on process used to process a spinning semiconductor substrate based on a localized fluid velocity of a processing liquid dispensed onto a surface of the spinning semiconductor substrate. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Spin-on processes are commonly used to dispense processing liquid(s) onto a surface of a semiconductor substrate while the substrate is rotating or spinning at a given rotational speed. In spin-on processes, processing liquid(s) are dispensed from one or more nozzles onto the spinning substrate surface. The nozzle(s) may be fixed or movable and can be positioned above and/or below the substrate surface, depending on the surface(s) desired to be coated with the processing liquid.

As noted above, the local fluid dynamics of a processing liquid dispensed onto a spinning substrate may adversely affect the local area performance of the substrate. For example, the local fluid dynamics introduced during a conventional spin-on process may adversely affect critical dimensions on a patterned substrate, cause pattern collapse, etc. These local fluid dynamic effects may arise, for example, from the pattern orientation relative to the radial liquid front, the pattern height and/or the process recipe used to perform the spin-on process (for example, the flow rate of the processing liquid dispensed onto the substrate, the rotational speed of the spin chuck, the scan rate or scan position of the nozzle, etc.).

Various embodiments of systems and methods are provided in the present disclosure to avoid the adverse local fluid dynamic effects that occur on patterned substrates during conventional spin-on processes. More specifically, the present disclosure provides embodiments of improved processing systems and methods that control operational parameter(s) of a spin-on process based on a localized fluid velocity of a processing liquid dispensed onto a surface of a spinning semiconductor substrate.

In the disclosed embodiments, a tracer is introduced within, or incorporated onto a surface of, the processing liquid as the processing liquid is dispensed onto the spinning semiconductor substrate. Movement of the tracer is tracked over time, as the tracer flows along with the processing liquid across the spinning substrate surface, to determine a localized fluid velocity of the processing liquid at one or more radial positions on the substrate surface. Once determined, the localized fluid velocity can be used to control one or more operational parameters of a spin-on process currently in progress or subsequently performed. By controlling the operational parameters of the spin-process based on the localized fluid velocity, the embodiments disclosed herein avoid the local fluid dynamic effects that tend to adversely affect the local area performance of patterned substrates during conventional spin-on processes. Though some embodiments describe use of a single tracer, it will be recognized that one or more tracers may be utilized.

Figure 2:
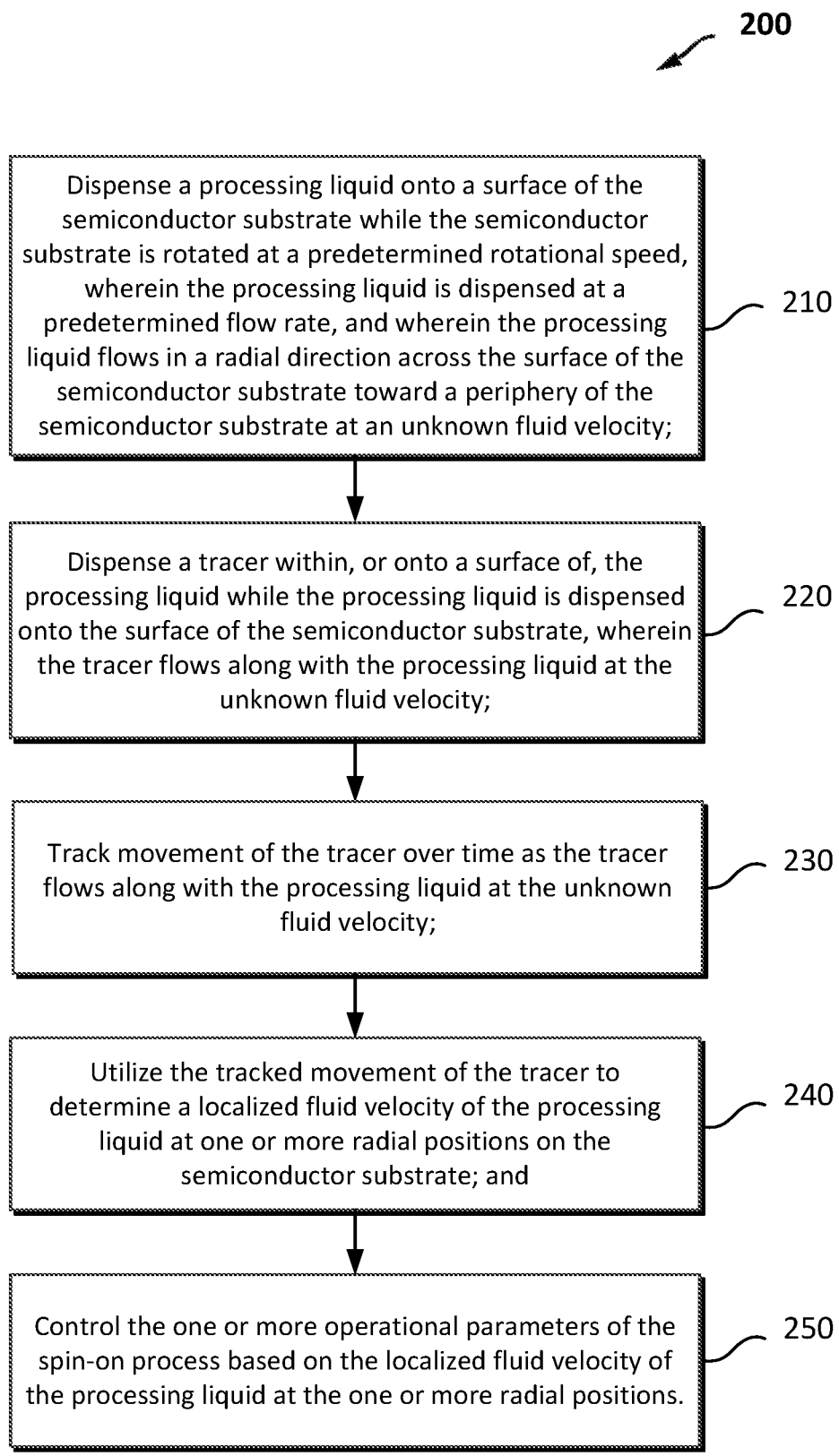
FIG. 2 is a flowchart diagram illustrating one embodiment of a method that determines a localized fluid velocity of a processing liquid on a spinning semiconductor substrate and controls operational parameters of a spin-on process based on the localized fluid velocity.

Turning now to the Drawings, FIG. 2 illustrates one embodiment of a method 200 in accordance with the present disclosure. More specifically, FIG. 2 illustrates one embodiment of a method 200, which can be used to determine a localized fluid velocity of a processing liquid dispensed onto a surface of a spinning semiconductor substrate and control operational parameters of a spin-on process based on the determined localized fluid velocity.

The method 200 shown in FIG. 2 may determine the localized fluid velocity offline during a testing phase, or dynamically while performing a spin-on process to process a semiconductor substrate. In some embodiments, the localized fluid velocity may be determined during an initial testing phase to determine an optimum process recipe for processing a semiconductor substrate during a subsequently performed spin-on process. In other embodiments, the localized fluid velocity may be determined dynamically during a spin-on process and used to adjust the process recipe in real-time as the semiconductor substrate is being processed.

In some embodiments, the method 200 may begin (in step 210) by dispensing a processing liquid onto a surface of a semiconductor substrate while the semiconductor substrate is rotated at a predetermined rotational speed (for example, a rotational speed within a range of 200 to 3000 rotations per minute, RPM). Although the processing liquid is dispensed onto the substrate surface at a predetermined flow rate, the rate (or "fluid velocity") with which the processing liquid flows radially across the surface of the spinning substrate is dependent on characteristics of the processing liquid (for example, the viscosity of the processing liquid), characteristics of the substrate (for example, a patterned vs. unpatterned substrate, the pattern orientation and pattern height of a patterned substrate, etc.) and characteristics of the spin-on process (for example, the flow rate of the processing liquid dispensed onto the substrate, the rotational speed of the spin chuck, the scan rate or scan position of the nozzle, etc.). As a consequence, the processing liquid dispensed onto the substrate surface (in step 210) flows in a radial direction across the surface of the semiconductor substrate toward a periphery of the semiconductor substrate at an unknown fluid velocity.

The method 200 further includes dispensing a tracer within, or onto a surface of, the processing liquid while the processing liquid is dispensed onto the surface of the semiconductor substrate (in step 220). A wide variety of tracers may be dispensed in step 220. In some embodiments, the tracer may be dispensed onto the surface of processing liquid in step 220. Examples of tracers that may be dispensed onto the surface of processing liquid include, but are not limited to, foaming agents and immiscible liquids. Foaming agents (such as surfactants and/or blowing agents) facilitate the formation of bubbles or foam, which interface with the surface of the processing liquid and flow along with the processing liquid at the unknown fluid velocity. Immiscible liquids include solvents that do not mix with the processing liquid. When an immiscible liquid is used as a tracer, droplets of the immiscible liquid are dispensed onto the surface of the processing liquid at a predetermined duty cycle. The droplets of the immiscible liquid interface with the surface of the processing liquid and flow along with the processing liquid at the unknown fluid velocity.

In other embodiments, the tracer may be dispensed within processing liquid in step 220. Examples of tracers that may be dispensed within the processing liquid include, but are not limited to, gas bubbles, optical sensor contrast agents, pH indicators, fluorescent species and phosphorescent species. In some embodiments, the tracer may be incorporated within the processing liquid before the processing liquid and the tracer are dispensed onto the surface of the semiconductor substrate in steps 210 and 220. In such embodiments, the processing liquid and the tracer may be dispensed through a single nozzle. In other embodiments, the tracer may be incorporated within the processing liquid after the processing liquid has begun dispensing in step 210. In such embodiments, the processing liquid may be dispensed through a first nozzle and the tracer may be dispensed through a second nozzle.

The method 200 further includes tracking movement of the tracer over time as the tracer flows along with the processing liquid at the unknown fluid velocity (in step 230), and utilizing the tracked movement of the tracer to determine a localized fluid velocity of the processing liquid at one or more radial positions on the semiconductor substrate (in step 240). A wide variety of methods may be used to track the movement of the tracer. In some embodiments, movement of the tracer may be tracked in step 230 by obtaining a plurality of images of the surface of the semiconductor substrate as the tracer flows along with the processing liquid at the unknown fluid velocity. In such embodiments, method 200 analyzes the plurality of images to determine a first radial position of the tracer at a first time and a second radial position of the tracer at a second time, which is greater than the first time, and determines the localized fluid velocity of the processing liquid at the second radial position (in step 240) by dividing a difference between the second radial position and the first radial position by a difference between the second time and the first time.

The method 200 further includes controlling one or more operational parameters of a spin-on process (in step 250) based on the localized fluid velocity of the processing liquid previously determined in step 240. For example, the method 200 may control the predetermined rotational speed at which the semiconductor substrate is rotated, the predetermined flow rate at which the processing liquid is dispensed, the position of a nozzle dispensing the processing liquid and/or the scan rate of the nozzle in step 250. By controlling one or more operational parameters of the spin-on process based on the localized fluid velocity of the processing liquid determined in step 240, method 200 avoids creating local fluid dynamics that could adversely affect local area performance of the substrate during spin processing.

The method 200 shown in FIG. 2 may be performed within a wide variety of processing systems that perform spin processing. Various embodiments of example processing systems are shown in FIGS. 3-6 and described in more detail below. In each of the illustrated embodiments, the process system includes a spin chuck 310, a liquid dispense system 320, an optical sensor 330 and a controller 340 having at least one programmable integrated circuit (IC) 350 for executing program instructions 360 stored within non-transitory memory. Although not depicted in the drawings, the processing systems shown in FIGS. 3-6 may include other hardware and software components, as is known in the art.

Figure 1:
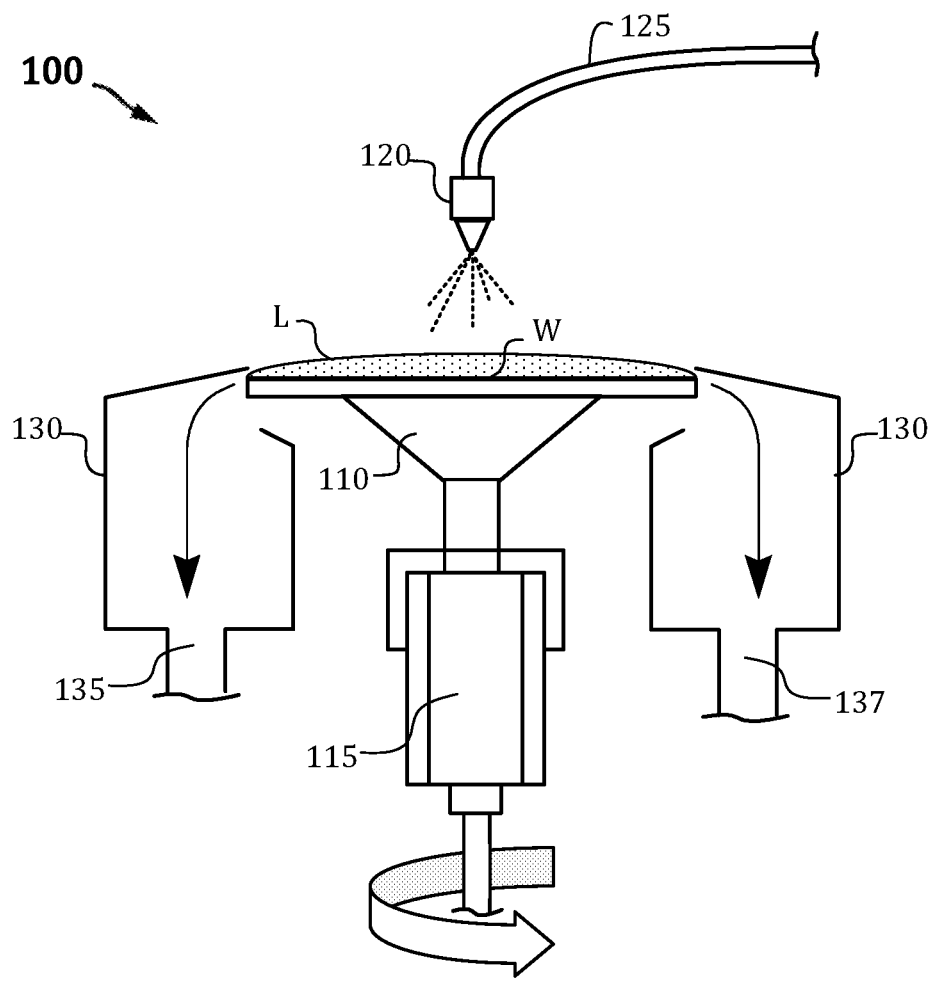
FIG. 1 (PRIOR ART) illustrates an interior of an example processing chamber having at least one nozzle for dispensing a processing liquid onto a surface of a spinning semiconductor substrate (W) during a spin-on process.

The spin chuck 310 has a support surface 312 for supporting a semiconductor substrate (W) and a drive mechanism (as shown, for example, in FIG. 1) for rotating the spin chuck 310 and the semiconductor substrate W mounted thereon at a predetermined rotational speed. The liquid dispense system 320 has at least one nozzle (for example, a first nozzle 322 and/or a second nozzle 324) for dispensing a processing liquid (L) and a tracer (T) onto a surface of the semiconductor substrate W while the semiconductor substrate is rotated by the spin chuck 310. Once dispensed, the processing liquid (L) and the tracer (T) flow in a radial direction (d) across the surface of the semiconductor substrate W toward a periphery of the substrate at an unknown fluid velocity. The optical sensor 330 tracks movement of the tracer (T) over time as the tracer flows along with the processing liquid (L) at the unknown fluid velocity, and generates an output signal that is supplied to the controller 340. The controller 340 analyzes the output signal received from the optical sensor 330 to determine a localized fluid velocity of the processing liquid (L) at one or more radial positions (P) on the semiconductor substrate W, and uses the localized fluid velocity to control one or more operational parameters of a currently or subsequently performed spin-on process.

Figure 3:
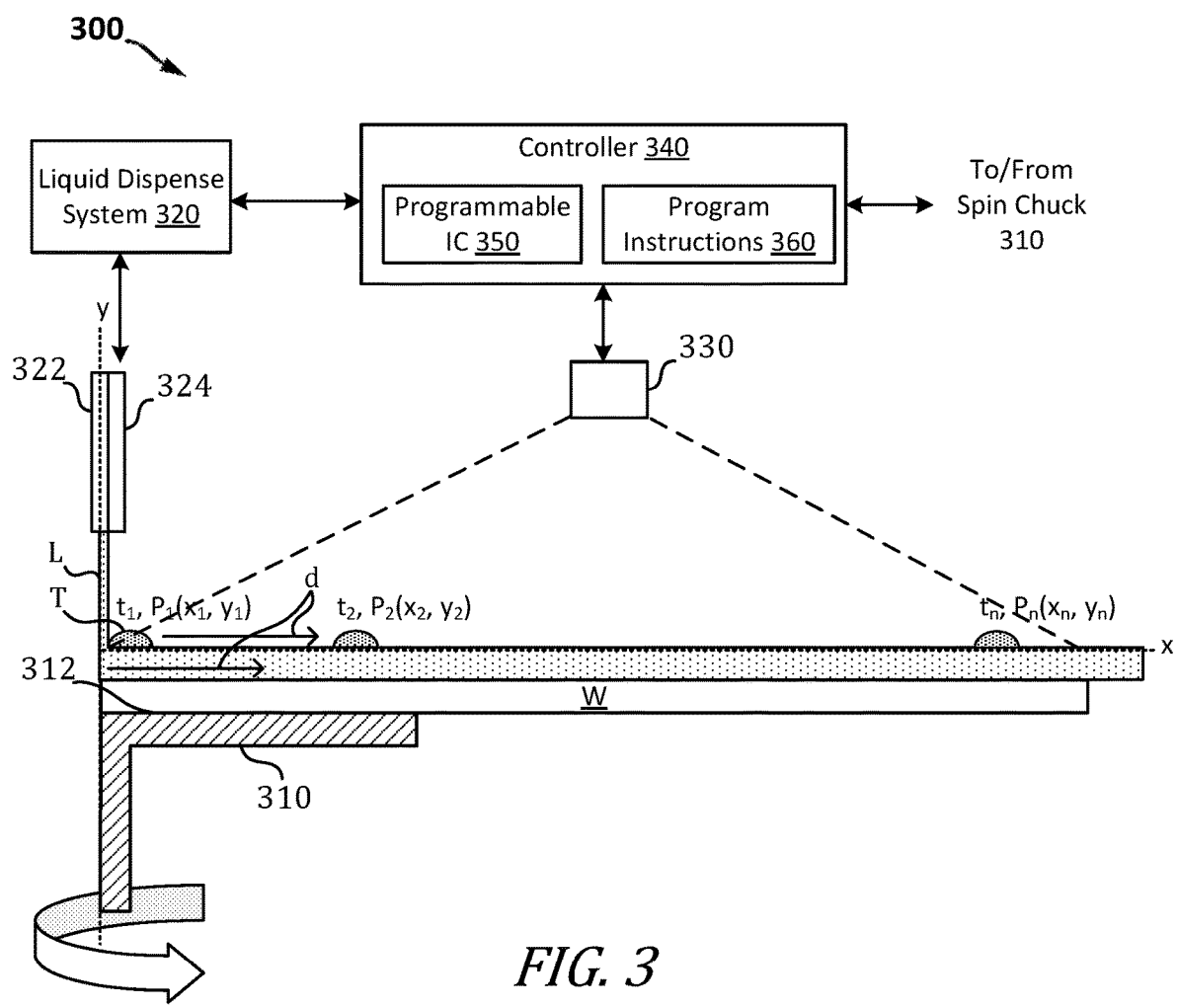
FIG. 3 is a block diagram illustrating a first embodiment of a processing system that utilizes the method shown in FIG. 2.

FIG. 3 illustrates a first embodiment 300 of a processing system that utilizes the method 200 shown in FIG. 2. In the embodiment 300 shown in FIG. 3, the controller 340 determines the localized fluid velocity of the processing liquid (L) by tracking movement of a tracer (T), which is dispensed onto a surface of the processing liquid while the semiconductor substrate is rotated by the spin chuck 310.

In the embodiment 300, the liquid dispense system 320 includes a first nozzle 322 for dispensing a processing liquid (L) onto the surface of the semiconductor substrate W, and a second nozzle 324 for dispensing a tracer (T) onto the surface of the processing liquid (L). The first nozzle 322 may be used to dispense a wide variety of processing liquids, depending on the spin-on process being characterized or performed. For example, the processing liquid (L) may be a coating liquid, an etchant chemical, a develop solution, a cleaning chemical or a rinse solvent. The second nozzle 324 may be used to dispense a wide variety of tracers (T), depending on the particular processing liquid (L) dispensed through the first nozzle 322.

In some embodiments, the second nozzle 324 may dispense a foaming agent, such as a surfactant and/or a blowing agent, onto the surface of the processing liquid (L). A surfactant is a material that reduces the surface tension of a liquid (i.e., reduces the work needed to create a foam) or increases its colloidal stability by inhibiting coalescence of bubbles. A blowing agent, on the other hand, is a gas that forms the gaseous part of the foam. When a foaming agent is provided by the liquid dispense system 320, the second nozzle 324 grows a surfactant bubble/foam until it interfaces with the processing liquid (L) dispensed by the first nozzle 322 and gets pulled along by the centrifugal forces from the spinning substrate.

Surfactants are usually organic compounds that contain a hydrophilic head and a hydrophobic tail, and are generally categorized by the chemical charge of their hydrophilic head. For example, surfactants may be categorized as either ionic (having a positive or negative charge) or non-ionic (having no charge). In some embodiments, a non-ionic surfactant may be utilized within the foaming agent. One example of a non-ionic surfactant is the Triton X-100 surfactant (2-[4-(2,4,4-trimethylpentan-2-yl)phenoxy]ethanol) provided by Dow Chemical. Triton X-100 is a non-ionic surfactant that has a hydrophilic polyethylene oxide chain and an aromatic hydrocarbon lipophilic or hydrophobic group. Other examples of non-ionic surfactants may also be used such as, but not limited to, pentapropylene glycol monododecyl ether, octapropylene glycol monododecyl ether, pentaethylene glycol monododecyl ether, octaethylene glycol monododecyl ether, nonoxynol 9, glycerol monolaurate, poloxamer, polyethoxylated tallow amine, lauramide monoethylamine, lauramide diethylamine, octyl glucoside, decyl glucoside, lauryl glucoside, digitonin, Tween, Tween 20, Tween 80, zonyl FSO, lauric acid, oleic acid and 2,5-dimethyl-3-hexyne-2,5-diol.

In some embodiments, the second nozzle 324 may dispense an immiscible liquid onto the surface of the processing liquid (L). Immiscible liquids include solvents that do not mix with the processing liquid being dispensed. When an immiscible liquid is utilized, the liquid dispense system 320 and the second nozzle 324 may create a series of liquid droplets at an average duty cycle that takes into consideration the sampling frequency of the optical sensor 330 and the predetermined flow rate of the processing liquid (L). The liquid dispense system 320 and the second nozzle 324 may grow the immiscible liquid droplet until it interfaces with the processing liquid (L) dispensed by the first nozzle 322 and gets pulled along by the centrifugal forces from the spinning semiconductor substrate W.

The choice of immiscible liquid generally depends on the processing liquid being utilized. For example, the immiscible liquid may be a hydrocarbon-based solvent (such as hexane, toluene, or cyclohexane) when the processing liquid (L) includes a 0.26N tetramethylammonium hydroxide (TMAH) solution and/or a deionized (DI) water rinse after 0.26N TMAH dispense. Other combinations of processing liquids and immiscible liquids may also be used. For example, DI water could serve as a immiscible liquid when the processing liquid (L) includes 2-heptanone, which is a common developer used for metal oxide resist development. For surface cleans, dimethylsulfoxide (DMSO) can be used for back end of line (BEOL) resist and polymer removal. When DMSO is used as the processing liquid (L), cyclohexane, pentane, hexane, heptane, isooctane and diethyl ester are examples of immiscible liquids that can be dispensed onto the surface of the processing liquid.

In the embodiment 300 shown in FIG. 3, the tracer (T) is introduced onto the surface of the processing liquid (L) by the second nozzle 324 after the first nozzle 322 has begun dispensing the processing liquid (L) onto the spinning substrate. The second nozzle 324 can be provided on the main primary dispense arm, or on a secondary dispense arm that is positioned over the substrate and ready to dispense during or after the processing liquid begins dispensing.

The progression of the tracer (T) on top of the processing liquid (L) is tracked continuously across the surface of the spinning substrate by the optical sensor 330. In some embodiments, the optical sensor 330 may be a camera, which is positioned above the substrate surface and configured to capture a plurality of images of the substrate surface as the tracer (T) flows along with the processing liquid (L) at the unknown fluid velocity. In one embodiment, the optical sensor 330 may be a video camera having an image sensor (for example, a complementary metal oxide semiconductor (CMOS) image sensor), which is configured to capture images of the substrate surface at a specified frame rate. The images captured by the camera are provided to the controller 340 for image processing and analysis. The controller 340 is configured to analyze the images captured over time to track the progression of the tracer (T) and determine the local fluid velocity of the processing liquid (L) at various radial positions (P) on the substrate surface.

Figure 4:
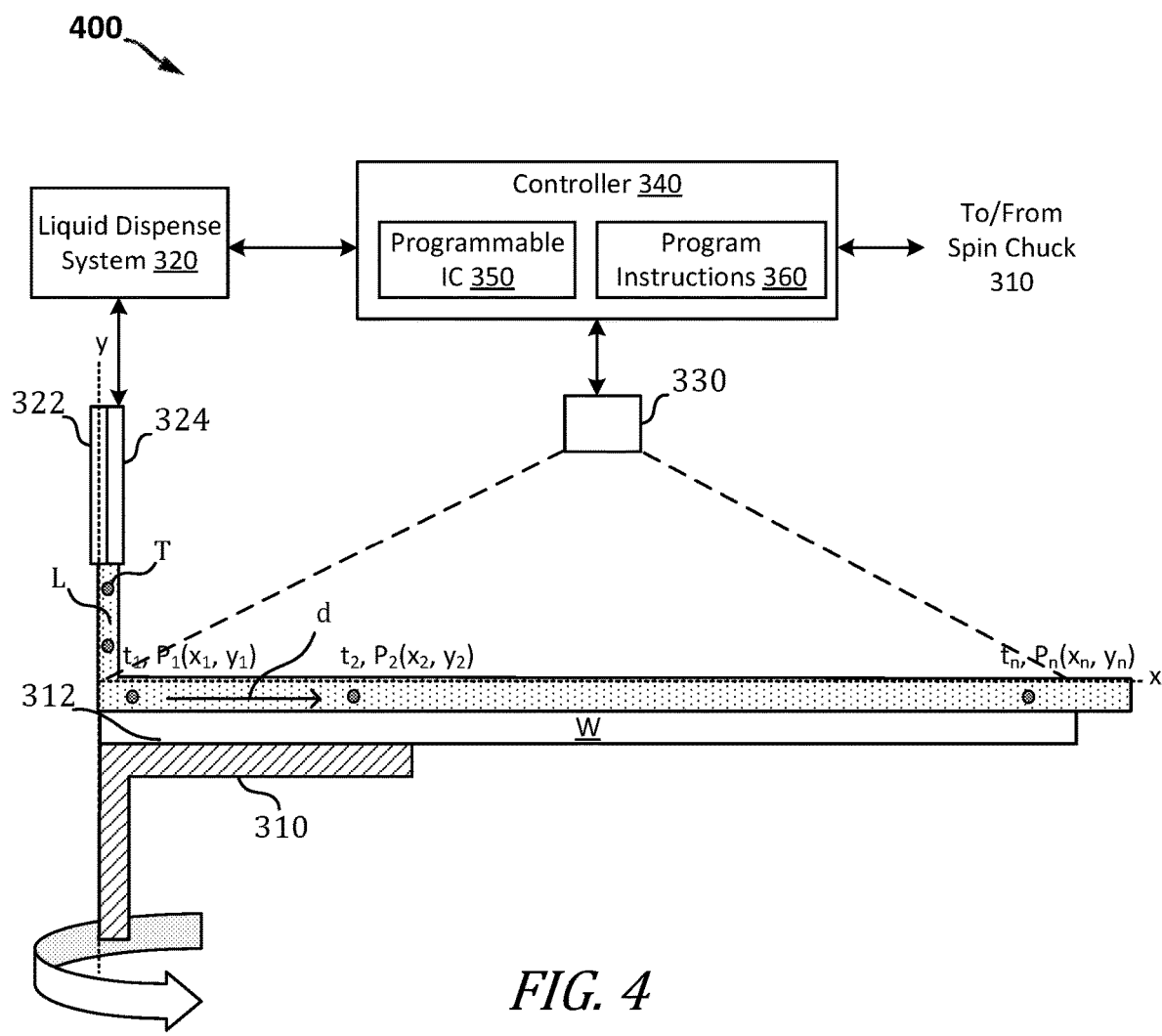
FIG. 4 is a block diagram illustrating a second embodiment of a processing system that utilizes the method shown in FIG. 2.

FIG. 4 illustrates a second embodiment 400 of processing system that utilizes the method 200 shown in FIG. 2. The embodiment 400 shown in FIG. 4 differs from the embodiment 300 shown in FIG. 3 by tracking movement of a tracer (T) that is incorporated within the processing liquid, instead of on top of the processing liquid.

In the embodiment 400, the liquid dispense system 320 includes a first nozzle 322 for dispensing a processing liquid (L) onto the surface of the semiconductor substrate W, and a second nozzle 324 for introducing a tracer (T) within the processing liquid (L) while the semiconductor substrate is rotated by the spin chuck 310. Although two nozzles are shown in FIG. 4, other embodiments of the processing system may include only one nozzle. When a single nozzle is utilized, the tracer (T) may be incorporated within the processing liquid (L) before the processing liquid and the tracer are dispensed together through the single nozzle onto the surface of the semiconductor substrate W.

Examples of tracers (T) that may be incorporated within the processing liquid (L) in the embodiment 400 shown in FIG. 4 include, but are not limited to, gas bubbles, optical sensor contrast agents and pH indicators. For example, gas bubbles may be introduced into the processing liquid (L) by dissolving gas (such as air, nitrogen, argon and other inert gases) into the processing liquid and inducing the dissolved gas out of solution during processing. Alternatively, gas bubbles may be introduced into the processing liquid (L) by injecting gas into the processing liquid (L) near the point of dispense (for example, by using a "T" dispense system with a narrow orifice gas inlet into the flow stream of the liquid channel).

Various optical sensor contrast agents can be utilized in the embodiment 400 shown in FIG. 4. For example, colored dyes can be used to maximize optical contrast against the spinning substrate when imaged with a visible spectrum color sensor (such as, for example, a CMOS camera). Examples of colored dyes that can be used as optical sensor contrast agents include, but are not limited to, dyes used in the food industry (such as triarylmethane dyes) and dyes used in the plastics industry (such as azo dyes, anthraquinone dyes and diarylide pigments). Additionally, a chemical that maximizes chemical absorption contrast in the shortwave infrared (SWIR) region can be used as an optical sensor contrast agent when combined with a SWIR camera (for example, an indium gallium arsenide (InGaAs) camera) and SWIR light source.

pH indicators include weak acids titrated in the presence of indicators that change color under slightly alkaline conditions, and weak bases titrated in the presence of indicators that change color under slightly acidic conditions. Trinitrobenzoic acid (pH monitoring range of 12.0-13.4) is one example of a pH indicator that can be used to not only determine the local fluid velocity of 0.26N TMAH solution (pH~13.4) at the localized (radial) position, but also to understand the evolution of the development process as resist and resist components solvate into the develop solution (which will lower the pH).

Figure 5:
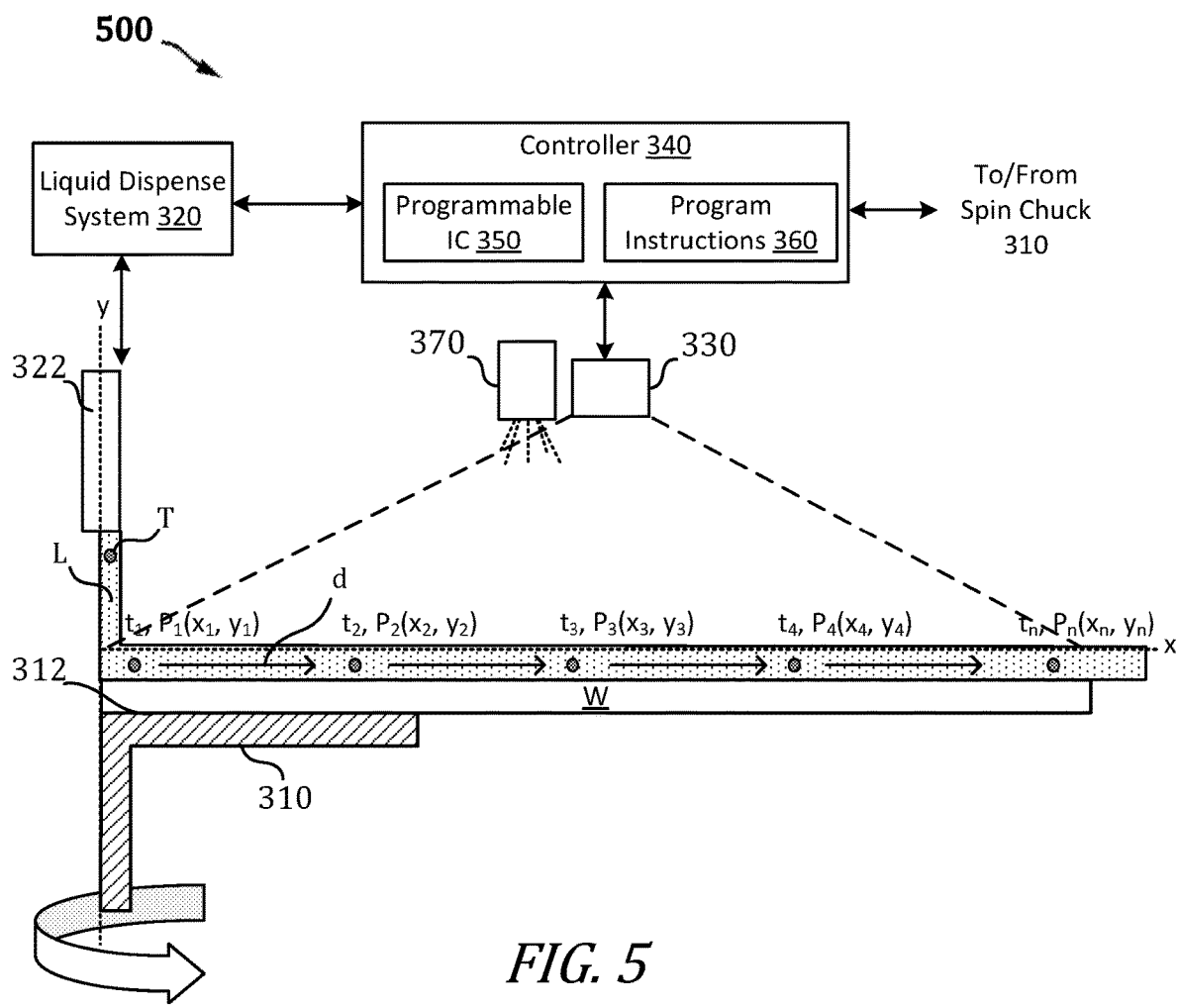
FIG. 5 is a block diagram illustrating a third embodiment of a processing system that utilizes the method shown in FIG. 2.
Figure 6:
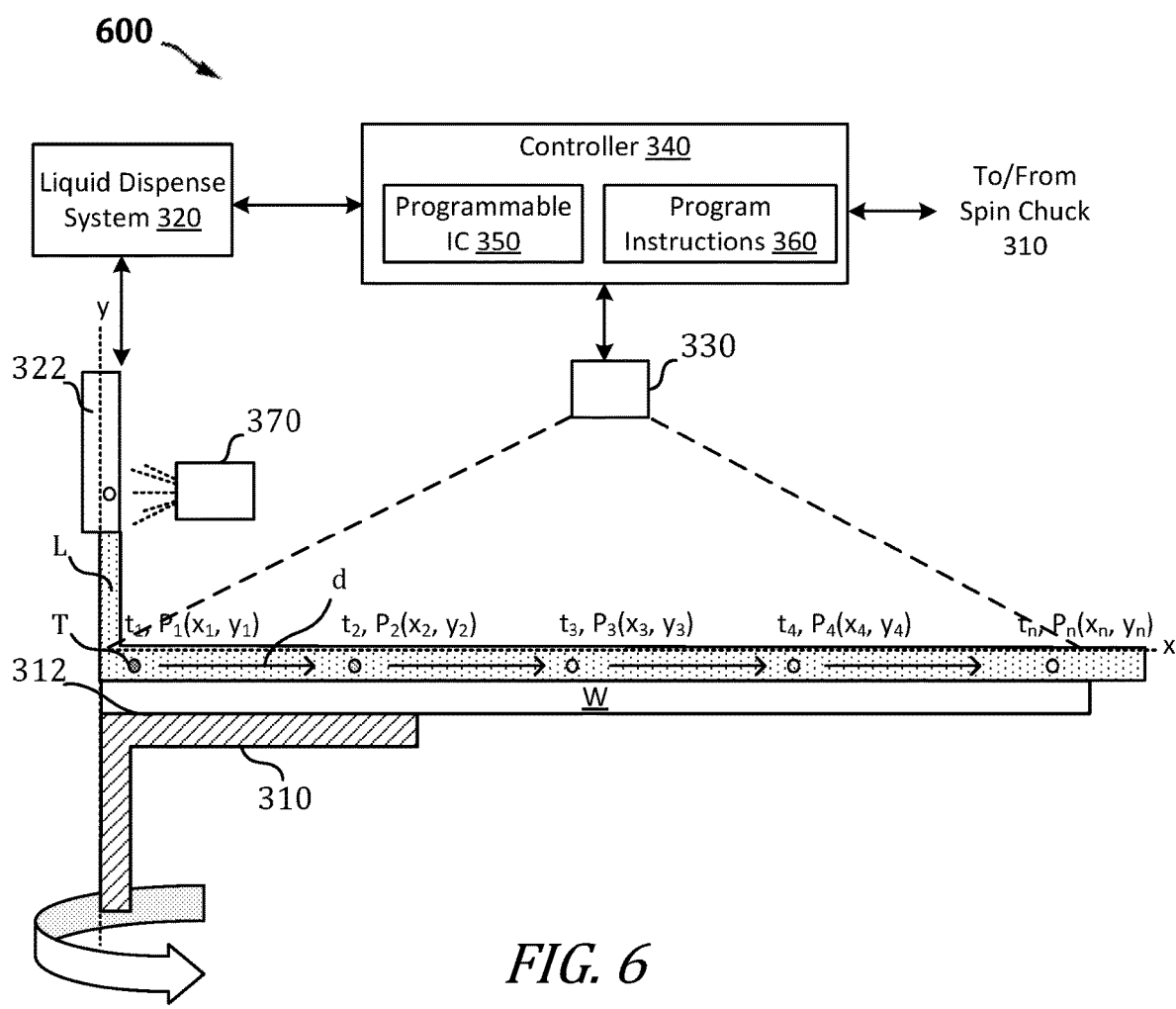
FIG. 6 is a block diagram illustrating a third embodiment of a processing system that utilizes the method shown in FIG. 2.

FIGS. 5 and 6 illustrate a third embodiment 500 and a fourth embodiment 600 of a processing system that utilizes the method 200 shown in FIG. 2. Unlike the embodiment 400 shown in FIG. 4, which incorporates non-emissive tracers (such as gas bubbles, optical sensor contrast agents or pH indicators) into the processing liquid (L), the embodiments shown in FIGS. 5 and 6 track the movement of an emissive tracer (T) incorporated within the processing liquid.

In the embodiments 500 and 600, the processing liquid (L) and the emissive tracer (T) are dispensed onto the surface of the semiconductor substrate W via the first nozzle 322 while the semiconductor substrate is rotated by the spin chuck 310. A light source 370 is included within the processing system for exposing the emissive tracer (T) to radiation (light), which causes the emissive tracer (T) to luminesce. The light source 370 may be directed toward the liquid dispense line or the substrate surface, depending on the particular emissive tracer being used.

In the embodiment 500 shown in FIG. 5, for example, the emissive tracer (T) incorporated within the processing liquid (L) may include a fluorescent species or a fluorescent dye. Examples of fluorescent dyes include cyanates, such as fluorescein isothiocyanate (FITC), which emits at 517 nm when excited at 495 nm, and tetramethylrhodamine-5-(and 6)-isothiocyanate (TRITC), which emits at 573 nm when excited at 550 nm. Given the shorter emission lifetimes of fluorescent materials, the light source 370 is directed toward the substrate surface in the embodiment 500 so that the entire substrate surface is continuously illuminated by the excitation wavelength. The fluorescent particles may be sparsely loaded, so that the continuous excitation and subsequent emission of a given fluorescent particle can be uniquely identified and tracked across the substrate surface by the optical sensor 330.

In some embodiments, colloidal metal nanoparticles (such as gold, silver or copper) that exhibit surface plasmon resonance can be added to the processing liquid (L) to increase sensitivity to fluorescence. Surface plasmons from nanoparticles increase fluorescence by enhancing the localized field around the fluorescent particle. Silver, for example, emits around the 450 nm wavelength but excitation depends on colloidal particle size. While the introduction of nanoparticles increases fluorescence, adding metals into the processing liquid may lead to contamination risks. As such, this method is more likely to be used during a testing phase to provide useful information for optimization and modeling.

In the embodiment 600 shown in FIG. 6, the emissive tracer (T) incorporated within the processing liquid (L) includes a phosphorescent species. Examples phosphorescent species include inorganic phosphorescent particles, such as zinc sulfide or strontium aluminate, that glow or phosphoresce when exposed to radiation of a shorter wavelength. Unlike fluorescent materials, phosphorescent materials do not immediately re-emit the radiation that it absorbs. Instead, a phosphorescent material absorbs some of the radiation energy and re-emits the absorbed radiation for a much longer time after the radiation source is removed.

Given the longer emission lifetimes of phosphorescent materials, a light source 370 directed toward the liquid dispense line could be used to excite the phosphorescent particles, as shown in FIG. 6, and the radiation emitted by the phosphorescent particles can be tracked by the optical sensor 330 as the particles progress across the spinning substrate.

In the embodiments shown in FIGS. 5 and 6, the optical sensor 330 detects the luminescence of the emissive tracer (T) as it progresses in the radial direction (d) across the spinning substrate. In some embodiments, optical sensor 330 may be a CMOS camera, which is coupled to capture images of the substrate surface as the emissive tracer (T) flows along with the processing liquid (L) at the unknown fluid velocity. The images captured by the camera are provided to the controller 340 for image processing and analysis. The controller 340 analyzes the images captured over time to track the progression of the emissive tracer (T) and determine the localized fluid velocity of the processing liquid (L) at various radial positions (P) on the substrate surface.

Controller 340 may determine the localized fluid velocity in a wide variety of ways. In one embodiment, the controller 340 may determine the rate at which the tracer (T) progresses from one radial position to another. As shown in FIGS. 3-6, for example, the tracer (T) dispensed within, or on the surface of, the processing liquid (L) progresses from a first radial position $P_1(x_1, y_1)$ at time $(t_1)$ to second radial position $P_2(x_2, y_2)$ at time $(t_2)$ to eventually an $n^{th}$ radial position radial position $P_n(x_n, y_n)$ at time $(t_n)$ near the periphery of the substrate. The optical sensor 330 obtains images of the substrate surface that depict the progression of the tracer (T) across the spinning substrate. The controller 340 receives the image frames captured by the optical sensor 330 over time and utilizes image processing and analysis software (contained, for example, within program instructions 360) to: (a) determine the radial position (P) of the tracer (T) as it progresses across the surface of the spinning substrate (for example, to $P_1, P_2, P_3, P_4 \ldots P_n$), and (b) determine the localized fluid velocity of the processing liquid (L) at one or more of the radial positions.

For example, the controller 340 may determine the localized fluid velocity (v) of the processing liquid (L) at the second radial position ($P_2$) by dividing a difference between the second radial position ($P_2$) and the first radial position ($P_1$) by a difference between the second time ($t_2$) and the first time ($t_1$) as shown in the equation 1 below.

$$v(P_2) = \frac{P_2 - P_1}{t_2 - t_1} \quad \text{EQ. 1}$$

The localized fluid velocity (v) at other radial positions (P) can be determined in a similar manner.

Once the localized fluid velocity (v) is determined at one or more radial positions (P), controller 340 may utilize the localized fluid velocity to control one or more operating parameters of a spin-on process. For example, the controller 340 may determine that the rotational speed of the spin chuck 310 and/or the flow rate of the processing liquid (L) dispensed by the first nozzle 322 should be adjusted to increase or decrease a fluid velocity of the processing liquid (L) across the substrate. In addition or alternatively, the controller 340 may determine that the scan position and/or scan rate of the first nozzle 322 should be adjusted to avoid deleterious local fluid dynamic effects in one or more areas of the substrate.

In some embodiments, the controller 340 may determine the localized fluid velocity (v) during an initial testing phase to determine an optimum process recipe for processing a semiconductor substrate during a subsequently performed spin-on process. In other embodiments, the controller 340 may determine the localized fluid velocity (v) dynamically during a spin-on process and may use the dynamically determined localized fluid velocity to adjust a process recipe on-the-fly as the semiconductor substrate is being processed.

Systems and methods for determining a localized fluid velocity of a processing liquid dispensed onto a spinning substrate are described in various embodiments. The systems and methods disclosed herein determine the localized fluid velocity of the processing fluid by tracking the movement of a tracer over time as the tracer flows along with the processing liquid at an unknown fluid velocity. A sensor (e.g., optical sensor 330) and controller (e.g., controller 340) are provided in each of the embodiments disclosed herein for tracking the movement of the tracer and utilizing the tracked movement of the tracer to determine a localized fluid velocity of the processing liquid at one or more radial positions on the semiconductor substrate. Once determined, the localized fluid velocity may be used to control operating parameter(s) of a current or subsequently performed spin-on process, and/or to determine additional information about the processing liquid and/or the process, as discussed further herein.

It is noted that the sensor and the controller described herein can be implemented in a wide variety of manners. In some embodiments, the sensor may be implemented as a CMOS camera or a SWIR camera, as discussed above. However, other optical sensors may also be utilized to track the movement of the tracer, depending on the particular tracer being used. For example, a photodiode, photodiode array or charge coupled device (CCD) array may be utilized, in some embodiments, to track the progression of the tracer across the surface of the spinning substrate. Exemplary sensors may include, but are not limited to, one dimensional and two dimensional sensors.

In one example, the controller 340 shown in FIGS. 3-6 may be a computer. In another example, controller 340 may include at least one programmable integrated circuit 350 that is programmed with program instructions 360 to provide the functionality described herein. For example, the controller 340 may include one or more processors (such as a microprocessor, microcontroller, central processing unit, etc.), programmable logic devices (such as a complex programmable logic device (CPLD), field programmable gate array (FPGA), etc.), and/or other programmable integrated circuits can be programmed with software or other programming instructions to implement the functionality described herein for controller 340. It is further noted that the software or other programming instructions can be stored in one or more non-transitory computer-readable mediums (such as, e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits may cause the programmable integrated circuits to perform the processes, functions, and/or capabilities described herein. Other variations could also be implemented.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems and methods described herein will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for controlling one or more operational parameters of a spin-on process used to dispense a processing liquid onto a surface of a semiconductor substrate, the method comprising:
    dispensing the processing liquid onto the surface of the semiconductor substrate while the semiconductor substrate is rotated at a predetermined rotational speed, wherein the processing liquid is dispensed at a predetermined flow rate, and wherein the processing liquid flows in a radial direction across the surface of the semiconductor substrate toward a periphery of the semiconductor substrate at an unknown fluid velocity;
    dispensing a tracer within, or onto a surface of, the processing liquid while the processing liquid is dispensed onto the surface of the semiconductor substrate, wherein the tracer flows along with the processing liquid at the unknown fluid velocity, wherein the tracer is a foaming agent or an immiscible liquid;
    tracking movement of the tracer over time as the tracer flows along with the processing liquid at the unknown fluid velocity;
    utilizing the tracked movement of the tracer to determine a localized fluid velocity of the processing liquid at one or more radial positions on the semiconductor substrate; and
    controlling the one or more operational parameters of the spin-on process based on the localized fluid velocity of the processing liquid at the one or more radial positions.

2. The method of claim 1, wherein said tracking the movement of the tracer over time comprises:
    obtaining a plurality of images of the surface of the semiconductor substrate as the tracer flows along with the processing liquid at the unknown fluid velocity.

3. The method of claim 2, wherein said utilizing the tracked movement of the tracer to determine the localized fluid velocity of the processing liquid at one or more radial positions comprises:
    analyzing the plurality of images to determine a first radial position of the tracer at a first time and a second radial position of the tracer at a second time, which is greater than the first time; and
    determining the localized fluid velocity of the processing liquid at the second radial position by dividing a difference between the second radial position and the first radial position by a difference between the second time and the first time.

4. The method of claim 1, wherein said controlling the one or more operational parameters of the spin-on process based on the localized fluid velocity of the processing liquid comprises controlling one or more of the following:
    the predetermined rotational speed at which the semiconductor substrate is rotated;
    the predetermined flow rate at which the processing liquid is dispensed;
    a position of a nozzle dispensing the processing liquid; and
    a scan rate of the nozzle.

5. The method of claim 1, wherein said dispensing the tracer comprises dispensing the tracer onto the surface of the processing liquid.

6. The method of claim 5, wherein the tracer is the foaming agent, and wherein said dispensing the tracer onto the surface of the processing liquid comprises:
dispensing the foaming agent to facilitate formation of bubbles, which interface with the surface of the processing liquid and flow along with the processing liquid at the unknown fluid velocity;
wherein the foaming agent comprises a non-ionic surfactant or a blowing agent.

7. The method of claim 5, wherein the tracer is the immiscible liquid, and wherein said dispensing the tracer onto the surface of the processing liquid comprises:
dispensing droplets of the immiscible liquid onto the surface of the processing liquid at a predetermined duty cycle, wherein the droplets of the immiscible liquid interface with the surface of the processing liquid and flow along with the processing liquid at the unknown fluid velocity;
wherein the immiscible liquid comprises a solvent that does not mix with the processing liquid.

8. A method for controlling one or more operational parameters of a spin-on process used to dispense a processing liquid onto a surface of a semiconductor substrate, the method comprising:
dispensing the processing liquid onto the surface of the semiconductor substrate while the semiconductor substrate is rotated at a predetermined rotational speed, wherein the processing liquid is dispensed at a predetermined flow rate, and wherein the processing liquid flows in a radial direction across the surface of the semiconductor substrate toward a periphery of the semiconductor substrate at an unknown fluid velocity;
dispensing a tracer within, or onto a surface of, the processing liquid while the processing liquid is dispensed onto the surface of the semiconductor substrate, wherein the tracer flows along with the processing liquid at the unknown fluid velocity, wherein the tracer is gas bubbles, an optical sensor contrast agent, a pH indicator, a fluorescent species or a phosphorescent species;
tracking movement of the tracer over time as the tracer flows along with the processing liquid at the unknown fluid velocity;
utilizing the tracked movement of the tracer to determine a localized fluid velocity of the processing liquid at one or more radial positions on the semiconductor substrate; and
controlling the one or more operational parameters of the spin-on process based on the localized fluid velocity of the processing liquid at the one or more radial positions.

9. The method of claim 8, wherein said dispensing the tracer comprises dispensing the tracer within the processing liquid.

10. The method of claim 8, further comprising incorporating the tracer within the processing liquid before dispensing the processing liquid and the tracer onto the surface of the semiconductor substrate through a single nozzle.

11. The method of claim 8, further comprising incorporating the tracer within the processing liquid after the processing liquid has begun dispensing onto the surface of the semiconductor substrate, wherein the processing liquid is dispensed through a first nozzle and the tracer is dispensed through a second nozzle.

12. The method of claim 8, wherein said tracking the movement of the tracer over time comprises:
obtaining a plurality of images of the surface of the semiconductor substrate as the tracer flows along with the processing liquid at the unknown fluid velocity.

13. The method of claim 12, wherein said utilizing the tracked movement of the tracer to determine the localized fluid velocity of the processing liquid at one or more radial positions comprises:
analyzing the plurality of images to determine a first radial position of the tracer at a first time and a second radial position of the tracer at a second time, which is greater than the first time; and
determining the localized fluid velocity of the processing liquid at the second radial position by dividing a difference between the second radial position and the first radial position by a difference between the second time and the first time.

14. The method of claim 8, wherein said controlling the one or more operational parameters of the spin-on process based on the localized fluid velocity of the processing liquid comprises controlling one or more of the following:
the predetermined rotational speed at which the semiconductor substrate is rotated;
the predetermined flow rate at which the processing liquid is dispensed;
a position of a nozzle dispensing the processing liquid; and
a scan rate of the nozzle.

* * * * *